US009733318B2

(12) United States Patent
Prussmann et al.

(10) Patent No.: US 9,733,318 B2
(45) Date of Patent: Aug. 15, 2017

(54) OBSERVATION OF AXIAL MAGNETIZATION OF AN OBJECT IN A MAGNETIC FIELD

(75) Inventors: Klaas Prussmann, Zurich (SE); Christoph Barmet, Zurich (SE)

(73) Assignees: Eidgenossische Technische Hochschule (ETH), Zurich (CH); Universitat Zurich, Zurich (CH)

( * ) Notice: Subject to any disclaimer, the term of this patent is extended or adjusted under 35 U.S.C. 154(b) by 856 days.

(21) Appl. No.: 14/112,674

(22) PCT Filed: Apr. 23, 2012

(86) PCT No.: PCT/EP2012/057413
§ 371 (c)(1),
(2), (4) Date: Feb. 28, 2014

(87) PCT Pub. No.: WO2012/143571
PCT Pub. Date: Oct. 26, 2012

(65) Prior Publication Data
US 2014/0312896 A1    Oct. 23, 2014

(30) Foreign Application Priority Data
Apr. 22, 2011  (EP) .................... 11163610

(51) Int. Cl.
*G01V 3/00*     (2006.01)
*G01R 33/24*    (2006.01)
G01R 33/567    (2006.01)

(52) U.S. Cl.
CPC .......... *G01R 33/24* (2013.01); *G01R 33/5676* (2013.01)

(58) Field of Classification Search
USPC ........................................ 324/301
See application file for complete search history.

(56) References Cited

U.S. PATENT DOCUMENTS 4,567,439 A * 1/1986 McGregor ............. G01R 33/26
                                                324/301
8,334,690 B2 * 12/2012 Kitching ............ G01R 33/0286
                                                324/301

(Continued)

FOREIGN PATENT DOCUMENTS

EP      1 582 886 A1    10/2005
WO      WO 95/17684      6/1995
WO      WO 2007/118715 A1 10/2007

OTHER PUBLICATIONS

John F. Schenck, "The role of magnetic susceptibility in magnetic resonance imaging: MRI magnetic compatibility of the first and second kinds", Med. Phys. 23(6): p. 815-850 (1996).
S. Groeger et al., "Laser-pumped cesium magnetometers for high-resolution medical and fundamental research", Sensors and Actuators A 129, p. 1-5 (2006).

(Continued)

*Primary Examiner* — Rodney Fuller
(74) *Attorney, Agent, or Firm* — George Pappas

(57) ABSTRACT

A method of observing axial magnetization ($M_z$) in an object (O) located in a main magnetic field ($B_0$) comprises the step of determining magnetic field intensity ($B_p$) in at least one magnetic field probe (P) arranged in the neighborhood of the object. The magnetic field probe comprises a magnetic resonance (MR) active substance, means for pulsed MR excitation of the substance and means for receiving an MR signal generated by said substance.

19 Claims, 2 Drawing Sheets

(56) References Cited

U.S. PATENT DOCUMENTS

| | | | | |
|---|---|---|---|---|
| 8,519,705 B2* | 8/2013 | Savukov | ............... | G01R 33/26 324/301 |
| 9,448,289 B2* | 9/2016 | Wang | ............... | G01R 33/24 |
| 2005/0218892 A1* | 10/2005 | Pruessmann | ............... | G01R 33/24 324/307 |
| 2007/0116602 A1* | 5/2007 | Lee | ............... | G01N 24/08 422/82.01 |
| 2008/0018333 A1* | 1/2008 | Zhu | ............... | G01R 33/24 324/301 |
| 2009/0295389 A1* | 12/2009 | Pruessmann | ............... | G01R 33/24 324/318 |
| 2012/0100546 A1* | 4/2012 | Lowery, Jr. | ............... | C12Q 1/6895 435/6.12 |
| 2012/0141003 A1* | 6/2012 | Wang | ............... | G01R 33/24 382/131 |
| 2015/0150475 A1* | 6/2015 | Varcoe | ............... | A61B 5/04005 600/409 |
| 2015/0241530 A1* | 8/2015 | Schmid | ............... | G01R 33/422 324/322 |

OTHER PUBLICATIONS

P. Sipila et al., Robust, susceptibility-matched NMR probes for compensation of magnetic field imperfections in magnetic resonance imaging (MRI); Sensors and Actuators, A 145-146, p. 139-146 (2008).

K.P. Pruessmann, et al., "Observation of cardiovascular dynamics by field recording with an NMR probe", Proc. Intl. Soc. Mag. Reson. Med. 19, p. 1171 (2011).

B.L. van de Bank, et al., "Frequency correction for MR Spectroscopy in the human breast at 7 Tesla with external field monitoring", Proc. Intl. Soc. Mag. Reson. Med. 19 (2011) p. 646.

S. Gross, "Measurement of Longitudinal Nuclear Magnetisation with NMR Probes, Master Thesis in Experimental Physics", Online Internet Article, Feb. 2011.

C. Barmet et al., "Spatiotemporal Magnetic Field Monitoring for MR", Magnetic Resonance in Medicine 60: 187-197 (2008).

N. De Zanche et al., "NMR Probes for Measuring Magnetic Fields and Field Dynamics in MR Systems", Magnetic Resonance in Medicine 60: p. 176-186 (2008).

* cited by examiner

OBSERVATION OF AXIAL MAGNETIZATION OF AN OBJECT IN A MAGNETIC FIELD

This application claims priority from PCT application No. PCT/EP2012/057413 filed Apr. 23, 2012 which claims priory from European application No. EP 11163610.6 filed on Apr. 22, 2011, the disclosures of which are incorporated herein by reference.

FIELD OF THE INVENTION

The present invention generally relates to a method of observing axial magnetization in an object located in a main magnetic field.

BACKGROUND OF THE INVENTION

The observation of magnetization in an object or subject of interest disposed in an external magnetic field can provide valuable information on various phenomena of interest.

For example, the human body contains mainly diamagnetic materials with magnetic volume susceptibilities up to about $\chi=-10$ ppm (Schenck, Med. Phys. 23(6):815-850 (1996)). When placed in a magnetic field with a magnetic field intensity $B_0$, e.g. in a magnetic resonance (MR) imaging set-up, the magnetized body and its parts cause field changes up to the order of $\chi B_0$. At the body's surface and in the surrounding volume these effects typically drop to a small fraction of this value. However, in MR imaging magnets of typically between 1.0 T and 10.0 T, field fluctuations due, e.g., to physiological motion such as breathing reach amplitudes up to microtesla range outside the body. Heart motion and pulsatile blood flow equally cause magnetic field perturbations outside the chest. These indirectly reflect cardiac function and are hence interesting to observe. Dynamic variation of susceptibility effects can also occur due to physical, chemical or biological processes that change matter at the atomic, molecular or macroscopic level. For instance, the oxygenation and deoxygenation of blood change the magnetic properties of the contained hemoglobin. Observing such effects is interesting not only in the human body, animals or plants. It is also interesting for inanimate material samples as well as chemical and biological samples, including cell cultures and samples of body liquids.

Magnetic susceptibility is generally dominated by the magnetism of the electrons contained in a sample. However, another smaller susceptibility contribution also arises from atomic nuclei with non-zero spin such as $^1H$, $^2H$, $^{13}C$, $^{17}O$, $^{19}F$, $^{23}Na$ and $^{31}P$. The related nuclear magnetization is the basis of nuclear magnetic resonance (NMR) and its imaging variant, magnetic resonance imaging (MRI). Like electronic magnetization, in the thermal equilibrium nuclear magnetization is aligned with the background magnetic field, which conventionally defines the z axis of an NMR or MRI system.

In NMR processes, nuclear magnetization is observed by flipping it away from the z axis and observing the resulting transverse magnetization component based on it precession about the z axis. In this way, NMR and MRI measures nuclear magnetization. However, the actually observed physical quantity is its transverse component Mxy. It would be interesting to also observe the z component of nuclear magnetization, Mz. For instance, for measuring (distributions of) the longitudinal relaxation time, T1, this would be very beneficial. The value of Mz at a given time can be inferred by controlled flipping of the magnetization into the xy-plane and subsequent observation of the oscillating xy-signal. However, this approach only allows for snapshot information about Mz at a particular point in time and not for substantially continuous monitoring. Direct observation of Mz would solve this problem. Generally, the capability of observing not only Mxy but also Mz would add to the insight that can be gained in NMR and MRI experiments.

So for both types of magnetization, electronic and nuclear, one would like to observe Mz, i.e., the component parallel to the background field, by direct measurement.

NMR-based magnetic field probes have recently been used for monitoring fields and potential field perturbations generated by components of MR systems, including main magnets, gradients, and shim coils (Barmet et al. MRM 60:187-197 (2008)). At the temporal resolutions required for this purpose, i.e. at sampling rates of 1 kHz or higher, current probes offer field resolution in the order of microteslas (De Zanche et al. MRM 60:176-186 (2008)). However, for many applications, particularly for Mz determinations as mentioned hereinabove, it would be desirable to achieve even higher field resolution.

A magnetocardiography method by means of an external magnetometer based on magnetic resonance has previously been described (S. Groeger et al. Sensors and Actuators A 129: 1-5 (2006)). However, this method relies on a continuous detection of an optical anisotropy in laser-pumped Cesium vapor.

SUMMARY OF THE INVENTION

It has now been recognized that the field resolution of magnetic field probes based on the magnetic resonance principle scales strongly with the temporal resolution of the measurement. Therefore, at comparatively lower bandwidths a significantly higher field resolution can be achieved. At such level of sensitivity, MR probes enable measurements also of fields and field fluctuations that originate from the axial component of the magnetization of human body parts or other samples.

Therefore, according to one aspect of the invention, a method of observing axial magnetization (Mz) in an object located in a main magnetic field comprises the steps of (i) determining magnetic field intensity ($B_P$) in at least one magnetic field probe (P) arranged in the neighborhood of the object, said magnetic field probe comprising a magnetic resonance (MR) active substance, means for pulsed MR excitation of said substance and means for receiving an MR signal generated by said substance, and (ii) obtaining from said magnetic field intensity ($B_P$) an observable (Az) that is proportional to said axial magnetization (Mz).

The term "object" shall be understood here as a general reference to an object of interest which may include a human subject or an animal, a part thereof, but also any kind of sample that may be studied in the environment of a background magnetic field.

The term "observing" axial magnetization shall be understood here to encompass both an absolute measurement of Mz but also just a relative determination of Mz up to an arbitrary scaling factor, particularly for studying relative changes in Mz. In other words, it is often sufficient to determine an observable Az that is proportional to Mz. For an absolute determination of Mz it will be necessary to make appropriate calibrations, i.e. to calibrate the magnetic field probes, but also to accurately determine the geometric relationship of various components of an object which exhibit a magnetization and thus contribute to the effect observed in the field probe. Nevertheless, determining Mz up to a scaling factor allows investigation of many interesting phenomena such as monitoring various phases of cardiac physiology.

In the present context, an MR type magnetic field probe generally comprises a magnetic resonance (MR) active substance, means for pulsed MR excitation of said substance and means for receiving an MR signal generated by said substance. It will be understood that in order to provide acceptable signal levels, the MR probes require the presence of a sufficiently intense main magnetic field. Such MR probes have been described e.g. in EP 1 582 886 A1 or in WO 2007/118715 A1. These probes exploit a nuclear magnetic resonance (NMR) transition of a predetermined nuclear species of the MR active substance.

Although the observation of Mz may be limited to one particular point in time by carrying out a "one-shot" measurement, it will generally be advantageous or even required to repeat the magnetic field intensity determination at a predetermined sampling rate. It has been found that excellent sensitivity can be achieved with sampling rates of up to 500 Hz, for example from 0.5 to 200 Hz, particularly from 1 to 150 Hz, more particularly 5 to 100 Hz. Conveniently, this frequency range covers many physiologically, biologically, chemically and technically relevant phenomena.

In principle, the MR magnetic field probes could be operated on an electron spin resonance transition. In an advantageous embodiment, the field probes operate on a nuclear magnetic resonance transition. Examples of suitable nuclei comprise, but are not limited to, $^1$H or $^9$F.

For some applications it would be sufficient to use just one magnetic field probe. In many situations, however, it will be advantageous to observe the field generated by an Mz distribution at multiple positions around the object. For instance, with an array of field probes placed on or near the chest wall in the area of the heart, information about the spatiotemporal distribution of Mz in the heart and surrounding vessels can be obtained. Such information will permit inferences about the course of cardiac action and blood flow. It will reflect features and abnormalities of cardiac physiology such as the heart rate, the amplitude of cardiac contraction, and arrhythmia. Likewise, a similar array placed at the surface of the head yields information about the spatial distribution of Mz in the brain, which varies with the relative blood volume, blood oxygenation, and blood pulsation, as well as, likely, in the course of metabolic processes. Particularly, by observing changes in blood oxygenation via Mz, inferences about brain activity similar to so-called blood-oxygenation-level-dependent (BOLD) MRI are possible. The use of multiple field probes at different positions is also preferred for Mz observations of largely uniform samples such as a vial filled with a sample liquid. In this case, multiple probes permit distinguishing between dynamics of Mz in the sample and potential confounding fluctuations of the background field.

In a particularly preferred embodiment the measurements are carried out with a plurality of four or even more numerous magnetic field probes so as to determine multiple patterns of background fields (such as e.g. spherical harmonics) to be subtracted from the acquired field measurements. An advantageous geometric arrangement of four probes is that of a tetrahedron surrounding the region of interest, but other geometric arrangements may be appropriate for specific situations.

In a further embodiment, the method further comprises the step of subtracting a background magnetic field from each one of said respective magnetic field intensities. Preferably, the background magnetic field is modeled as a linear combination of preselected basis functions.

According to an advantageous embodiment, the method further comprises the step of calculating an absolute value of the axial magnetization Mz from said observable Az.

In an advanced implementation of the invention, the nuclear part of the object magnetization is manipulated by nutation through a radiofrequency magnetic field. This option permits observations of axial nuclear magnetization. For instance, after an initial radiofrequency pulse that inverts the nuclear Mz, its relaxation towards thermal equilibrium can be observed by continuous field measurements with one or multiple field probes.

Therefore, according to one embodiment, the method further comprises the step of manipulating nuclear magnetization of an MR active nuclear species in said object. This is achieved by applying at least one radiofrequency field and optionally at least one gradient field before or concomitantly with said observing of Mz. In one embodiment, the manipulation of nuclear magnetization is used for determining a nuclear relaxation property of said MR active nuclear species from the temporal behavior of said observed axial magnetization (Mz). For example, one may determine the longitudinal relaxation time T1 of a nuclear species in a sample, which is useful for characterizing contrast media and magnetically labeled cells, molecules, functionalized vesicles, etc.

According to one embodiment, the object of interest is a material sample, a water sample, a sample of body liquid, a cell culture, or a plant or part thereof. Observing the axial magnetization Mz in such an object is used to study various material properties. Observing the axial magnetization Mz and its dynamics in such an object is used to study any mechanisms that affect electronic or nuclear magnetic susceptibility or the dynamics of non-equilibrium nuclear magnetization. These include physical processes such as temperature or pressure change, chemical processes such as oxidation that change the electron configuration of metal ions, and biological processes such as growth that affect the material distribution at the microscopic scale.

According to one embodiment, the object of interest is a live human or animal, i.e. a live subject, and the magnetic field probe or the plurality of magnetic field probes is/are mounted on a chest region of the subject for observing field fluctuations caused by the beating heart.

According to one embodiment, the object of interest is a live human or animal, i.e. a live subject, and axial magnetization (Mz) is observed for the purpose of controlling an MRI procedure carried out on the subject in said main magnetic field. For example, this may be used for triggering or gating an MRI procedure with respect to the subject's cardiac timing.

According to one embodiment, the object of interest is a live human or animal, i.e. a live subject, and axial magnetization (Mz) is observed for the purpose of monitoring the status and/or the compliance of the subject. For example, this may encompass monitoring cardiac function, breathing, head motion or limb motion.

According to one embodiment, the object of interest is a live human or animal, i.e. a live subject, and axial magnetization (Mz) is observed for the purpose of supporting signal processing and/or image reconstruction. For example, this may applied in the context of feed motion models or for removal of confounds from functional MRI (fMRI) time series.

According to one embodiment, the object of interest is a live human or animal, i.e. a live subject, and the magnetic field probe or the plurality of magnetic field probes is/are mounted on a head region for observing field fluctuations caused by physiological processes in the brain.

BRIEF DESCRIPTION OF THE DRAWINGS

The above mentioned and other features and objects of this invention and the manner of achieving them will become more apparent and this invention itself will be better understood by reference to the following description of various embodiments of this invention taken in conjunction with the accompanying drawings, wherein are shown.

Figure 2:
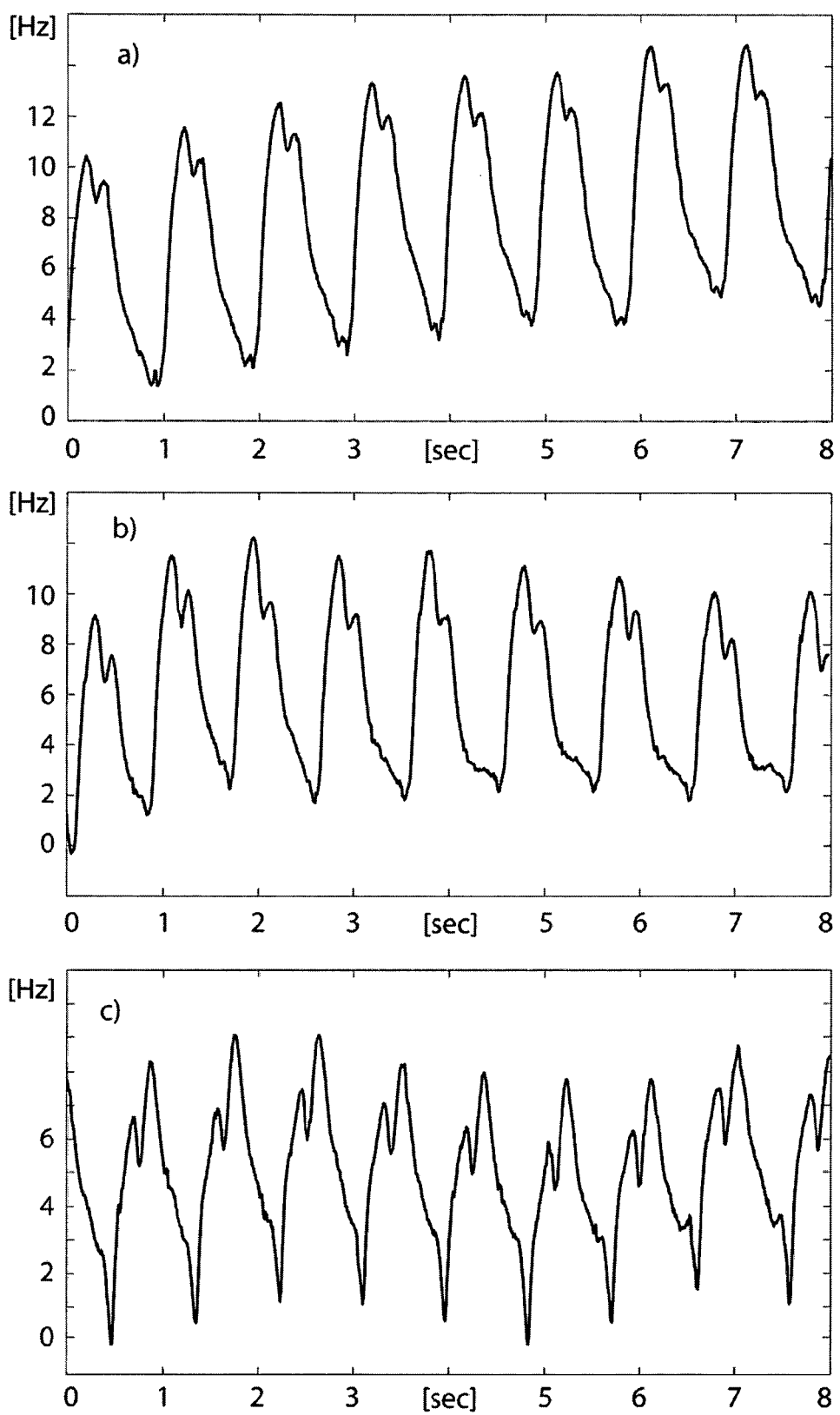

b) a further arrangement for the observation of a sample magnetization by means of four NMR field probes;

FIG. 2 the magnetic field (expressed in Hz) as a function of time, measured with an NMR field probe at three positions on a person's chest along the sternum.

DETAILED DESCRIPTION OF THE INVENTION

To carry out the methods of this invention, the object to be examined is placed in a background field, which magnetizes the object according to its electronic and nuclear susceptibility distributions. Preferably, the background field should be approximately uniform to magnetize the object evenly. Highly uniform magnetic fields as commonly used for NMR or MRI are suitable for this purpose. However, the invention can also be carried out in substantially less uniform fields.

One or multiple MR-based field probes are placed in the vicinity of the object. A single probe is preferably placed close to that part of the object that is of most interest. For observing cardiac dynamics, for instance, it should be placed on the chest wall close to the heart. A set of multiple field probes disposed on or near the surface of the object is used to achieve spatial resolution of the magnetic field generated by Mz beneath the surface. When examining a largely uniform sample such as a vial filled with a sample material, multiple field probes can be arranged to surround the sample.

The T1 and T2 relaxation times of the MR probes are chosen such as to support the desired rate of re-excitation. In a preferred mode of operation, the probes are re-excited for each field measurement, T2 is set as long as possible to still suppress significant echo formation by the interaction of successive excitation pulses, and T1 is chosen similar to T2.

In the arrangement shown in FIG. 1 a), there is an object (O) located in a main magnetic field (Bo). Typically this will be a person or animal, or a body part thereof, or any other object of interest. In this basic set-up there is just one single magnetic field probe (P) arranged in the neighborhood of the object. In this example the magnetic field probe comprises a magnetic resonance (MR) active substance 2 enclosed inside a small tube and means such as a surrounding solenoid 4 serving for pulsed MR excitation of the MR active substance and also for receiving an MR signal generated by the MR active substance. It is understood that the excitation and receiving means comprise further components not shown in these drawings, particularly electronic components for generating the RF excitation pulse and other electronic components for receiving and processing the probe signal. It is also understood that a design with a single solenoid is merely one of many possible configurations.

Figure 1A:
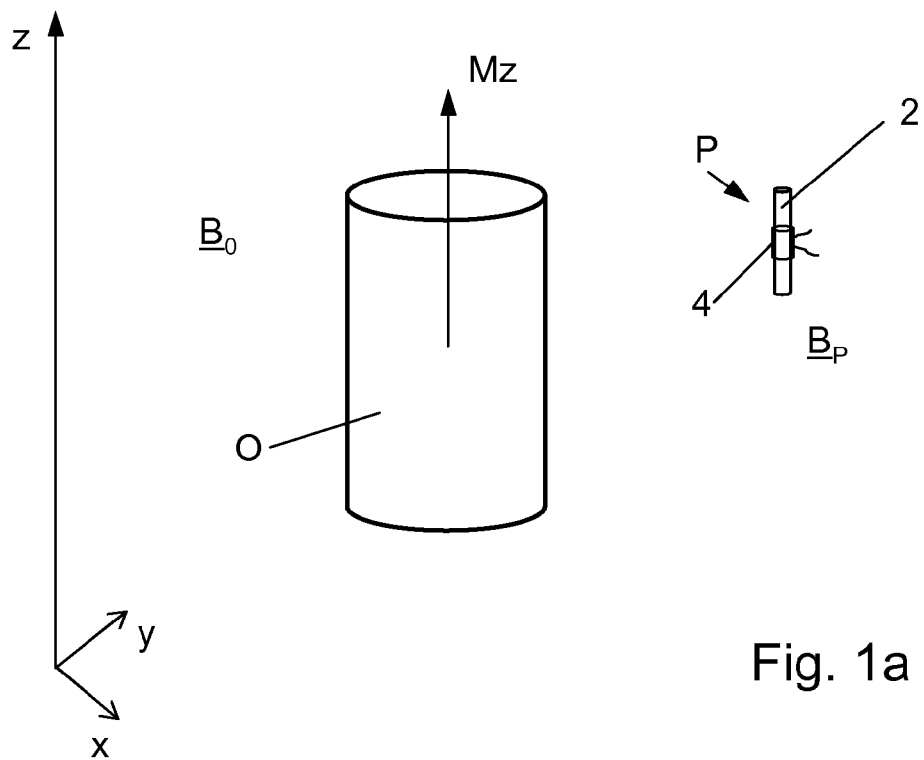
FIG. 1 a) a basic arrangement for the observation of a sample magnetization by means of one NMR field probe.

As may be appreciated from FIG. 1a, the magnetic field probe P allows determination of the magnetic field intensity ($B_P$) at the probe location. By selecting an appropriate probe design with a fast response time, the information gained from the probe provides a rather accurate determination of the time dependent function $B_P(t)$, which in turn provides information about the axial magnetization (Mz) in the object of interest.

Figure 1B:
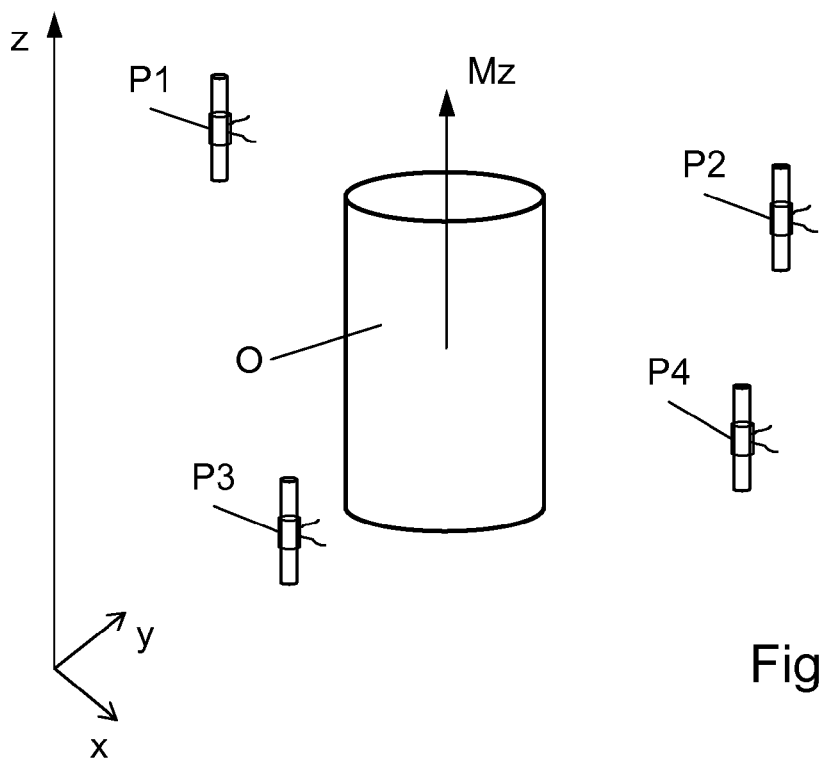

FIG. 1b shows an improved arrangement with four magnetic field probes P1, P2, P3, P4 arranged around the object of interest. By using more than one probe located at different places and at different distances from the object of interest, it is possible to better discriminate the requested Mz from any other spatiotemporal "background" effects.

To calculate the local field intensity from an interval of MR probe signal, first the signal phase (in radians) is extracted. The signal phase is uniquely defined only up to multiples of $2\pi$. This ambiguity is removed by standard phase unwrapping along the temporal dimension, i.e., by adding a suitable integer multiple of $2\pi$ to each phase value such that the resulting phase time course is continuous. The average angular frequency of the signal during the subject interval is then calculated by weighted linear regression of the unwrapped phase time course, using the magnitude of the probe signal for weighting. The corresponding field value for said interval is obtained by dividing the angular frequency by $2\pi$ and by the gyromagnetic ratio of the probe substance. Repeating this process for successive signal intervals yields a time series of field values.

Such a field time series represents the sum of the background field and its potential fluctuations, a small constant field shift induced by the magnetization of the field probe itself, and the desired field contribution from Mz in the object. The constant contributions of the background field and the probe-specific shift can easily be subtracted based on an initial reference field measurement with the same probe. However, fluctuations of the background field and fluctuations of Mz cannot straightforwardly be distinguished for single probes or sets of probes mounted on heterogeneous objects such as a human body.

However, in the case of a substantially uniform sample, e.g., a vial filled with a sample material, in a substantially uniform background field, a set of multiple field probes disposed around the sample can serve to eliminate background field fluctuations of low spatial order. To this end, it is necessary to know the probe positions $r_P$ either from reference measurements, e.g., based on frequency measurements in the presence of well-defined gradient fields, or by mounting them precisely in the first place. For each set of field values obtained in a given interval, one from each probe, processing then starts again by individually subtracting a probe-specific reference field value measured once initially and simultaneously with all probes. The resulting field values for said interval are conveniently assembled in a column vector b having one entry per probe. To remove the effects of background fluctuations from b, the underlying fields can be modeled as a linear combination of known basis functions $f_i(r)$. For magnetic fields in a source-free volume, spherical harmonics are a favorable basis. Evaluating these basis functions at the probe positions $r_P$ yields the matrix F having one row per probe and one column per basis function. Removal of background field fluctuations is then achieved by removing all components from b that lie in the space spanned by the columns of F. This is achieved by calculating $b'=(Id-FF^+)b$ where the superscript+denotes the Moore-Penrose pseudoinverse. The resulting field values listed in b' now all scale with the strength of Mz in the sample. For this approach to work, the number of probes must be larger than that of basis functions and they must be placed such that the matrix F has full rank.

Example: Observation of Cardiovascular Dynamics by Field Recording with an NMR Probe Targeting a temporal resolution of 10 ms, an NMR probe was built from a 2.2 mm borosilicate capillary filled with water and doped with $GdCl_3$ such as to obtain fast transverse relaxation with $T_2=3$ ms. For RF transmission and reception, the capillary was placed in a tightly wound solenoid coil made from PTFE-coated silver wire. The coil was tuned to 297.8 MHz, matched, and connected to custom-built transmit/receive circuitry including pre-amplification. Via coaxial cable, the preamplified signal was fed into a laboratory spectrometer (National Instruments) for demodulation and recording at a bandwidth of 1 MHz. The spectrometer was configured for continuous signal reception. The probe was excited via a custom-built transmit chain, consisting of a pulse generator, a modulation stage and a power amplifier.

For field measurements, the probe was excited every 10 ms with 90° block pulses of 10 μs each and its signal was received continuously, resulting in interruptions only by the excitation pulses and a few additional us of T/R switching and filter delay. The signal time course was then segmented into individual FIDs of just under 10 ms duration. The phase time courses of the FIDs were calculated, unwrapped, and subject to linear regression to give one frequency measurement per 10 ms interval.

Measurements were performed on a healthy volunteer in the bore of a Philips 7T Achieva whole-body MR system (Philips Healthcare, Cleveland, USA). The field probe was placed on the volunteer's chest, starting from the center of the sternum and gradually shifting it towards the head in steps of 2 cm. At each position, a field measurement was performed during a breathhold of 8 seconds.

FIG. 2 shows resulting time courses of frequency variation for the first three probe positions. They reveal substantial, highly periodic field variations at the cardiac frequency, which are attributed to motion of the heart and blood flow in the heart and the neighboring vasculature. As should be expected, the shape of these curves depends on the position of observation, indicating that the field fluctuations vary significantly across space and thus contain information about the position and geometry of the underlying anatomy.

The exact interpretation of the curves is intriguing and remains to be pursued. The most immediate question is arguably which type of motion causes the two distinct field peaks that are observed in each cycle at all three positions. They may reflect myocardial motion but may also be due to particular phases of blood flow in the heart and/or ascending aorta. Further studies will need to establish which aspects of cardiovascular dynamics are actually observed and how much more evidence can be gained by increasing the temporal and spatial resolution of the measurement. Increasing the latter is expected to be fairly straightforward by using an array of field probes. Increasing the temporal resolution will, among others, clarify the effective bandwidth of the field dynamics. The sharp negative peaks in FIG. 1 c) consist of single field samples, indicating that the underlying fluctuations last for less than 10 ms, thus suggesting a bandwidth of somewhat more than 100 Hz. If this observation can be confirmed and perhaps even higher-bandwidth dynamics can be observed, NMR-probe measurements may offer an alternative to ECG recording in the magnet.

The invention claimed is:

1. A method of observing axial magnetization (Mz) in an object (O) located in a main magnetic field ($B_0$), determining magnetic field intensity ($B_P$) in at least one magnetic field probe (P) arranged in the neighborhood of the object, said magnetic field probe comprising a magnetic resonance (MR) active substance, means for pulsed MR excitation of said substance and means for receiving an MR signal generated by said substance, said step of determining magnetic field intensity ($B_P$) comprising pulsed excitation of said substance with said means for pulsed MR excitation, said step of determining magnetic field intensity being carried out in a plurality of at least two magnetic field probes ($P_i$, with i=1 to n, n≥2), thereby providing respective magnetic field intensities ($B_{Pi}$, with i=1 to n, n≥2), said method further comprising the step of subtracting a background magnetic field ($B_B$) from each one of said respective magnetic field intensities Bpi, said step of determining magnetic field intensity being repeated at a predetermined sampling rate, said sampling rate being up to 100 Hz.

2. The method according to claim 1, wherein said background magnetic field ($B_B$) is modeled as a linear combination of preselected basis functions $f_1(r)$.

3. The method according to claim 2, wherein said pulsed excitation induces nuclear magnetic resonance of said substance.

4. The method according to claim 2, further comprising the step of obtaining from said magnetic field intensity ($B_P$) an observable (Az) that is proportional to said axial magnetization (Mz).

5. The method according to claim 2, further comprising the step of manipulating nuclear magnetization of an MR active nuclear species in said object by applying at least one radiofrequency field and optionally at least one gradient field before or concomitantly with said observing of axial magnetization (Mz).

6. The method according to claim 1, wherein said pulsed excitation induces nuclear magnetic resonance of said substance.

7. The method according to claim 6, further comprising the step of obtaining from said magnetic field intensity ($B_P$) an observable (Az) that is proportional to said axial magnetization (Mz).

8. The method according to claim 6, further comprising the step of manipulating nuclear magnetization of an MR active nuclear species in said object by applying at least one radiofrequency field and optionally at least one gradient field before or concomitantly with said observing of axial magnetization (Mz).

9. The method according to claim 6, further comprising the step of manipulating nuclear magnetization of an MR active nuclear species in said object by applying at least one radiofrequency field and optionally at least one gradient field before or concomitantly with said observing of axial magnetization (Mz).

10. The method according to claim 1, further comprising the step of obtaining from said magnetic field intensity ($B_P$) an observable (Az) that is proportional to said axial magnetization (Mz).

11. The method according to claim 10, further comprising the step of manipulating nuclear magnetization of an MR active nuclear species in said object by applying at least one radiofrequency field and optionally at least one gradient field before or concomitantly with said observing of axial magnetization (Mz).

12. The method according to claim 1, further comprising the step of manipulating nuclear magnetization of an MR active nuclear species in said object by applying at least one radiofrequency field and optionally at least one gradient field before or concomitantly with said observing of axial magnetization (Mz).

13. The method according to claim 12, further comprising the step of determining a nuclear relaxation property of said MR active nuclear species from the temporal behavior of said observed axial magnetization (Mz).

14. The method according to claim 1, wherein the object of interest is a material sample, a water sample, a sample of body liquid, a cell culture, or a plant or part thereof.

15. The method according to claim 1, wherein the object of interest is a live human or animal, wherein said at least one magnetic field probe is mounted on a chest region, for observing field fluctuations caused by the beating heart.

16. The method according to claim 1, wherein the object of interest is a live human or animal, wherein said observing of axial magnetization (Mz) is used to control an MRI procedure carried out in said main magnetic field.

17. The method according to claim 1, wherein the object of interest is a live human or animal, wherein said observing of axial magnetization (Mz) is used to monitor status and/or compliance of said human or animal.

18. The method according to claim 1 wherein the object of interest is a live human or animal, wherein said observing of axial magnetization (Mz) is used to to support signal processing anellor image reconstruction.

19. The method according to claim 1, wherein the object of interest is a live human or animal, wherein said at least one magnetic field probe is mounted on a head region, wherein said observing of axial magnetization (Mz) is used to observe field fluctuations caused by physiological processes in the brain.

* * * * *

UNITED STATES PATENT AND TRADEMARK OFFICE
CERTIFICATE OF CORRECTION

PATENT NO. : 9,733,318 B2
APPLICATION NO. : 14/112674
DATED : August 15, 2017
INVENTOR(S) : K. Prussmann et al.

Page 1 of 1

It is certified that error appears in the above-identified patent and that said Letters Patent is hereby corrected as shown below:

In the Specification

Column 3, Line 30, delete "$^9$F" and insert --$^{19}$F--

Signed and Sealed this
Third Day of October, 2017

Joseph Matal
*Performing the Functions and Duties of the*
*Under Secretary of Commerce for Intellectual Property and*
*Director of the United States Patent and Trademark Office*